United States Patent [19]
Daito

[11] Patent Number: 5,557,558
[45] Date of Patent: Sep. 17, 1996

[54] MICROPROCESSOR WITH SELF-DIAGNOSTIC TEST FUNCTION

[75] Inventor: Masayuki Daito, Tokyo, Japan

[73] Assignee: NEC Corporation, Tokyo, Japan

[21] Appl. No.: 441,654

[22] Filed: May 15, 1995

Related U.S. Application Data

[63] Continuation of Ser. No. 19,912, Feb. 19, 1993, abandoned.

[30] Foreign Application Priority Data

Feb. 19, 1992 [JP] Japan .................................. 4-031227

[51] Int. Cl.$^6$ .................................................. G05B 19/00
[52] U.S. Cl. ...................... 364/579; 364/580; 395/183.01
[58] Field of Search .................................. 364/579, 580; 324/73.1; 371/16.1; 395/575, 183.01

[56] References Cited

U.S. PATENT DOCUMENTS

| | | | |
|---|---|---|---|
| 3,603,936 | 9/1971 | Attwood et al. | 395/575 |
| 4,305,125 | 12/1981 | Sato et al. | 395/575 |
| 4,641,308 | 2/1987 | Sacarisen et al. | 371/16.1 |
| 5,068,783 | 11/1991 | Tanagawa et al. | 395/575 |
| 5,084,814 | 1/1992 | Vaglica et al. | 371/16.1 |
| 5,210,864 | 5/1993 | Yoshida | 395/575 |
| 5,226,149 | 7/1993 | Yoshida et al. | 395/575 |
| 5,228,139 | 7/1993 | Miwa et al. | 395/575 |
| 5,247,521 | 9/1993 | Akao et al. | 371/16.1 |
| 5,291,425 | 3/1994 | Nagaishi | 364/579 |
| 5,363,380 | 11/1994 | Shinohara | 371/16.1 |
| 5,384,784 | 1/1995 | Mori et al. | 364/579 |
| 5,398,250 | 3/1995 | Nozuyama | 371/16.1 |

FOREIGN PATENT DOCUMENTS

| | | |
|---|---|---|
| 2374688 | 7/1978 | France . |
| 1596850 | 3/1987 | United Kingdom . |

OTHER PUBLICATIONS

Patent Abstracts of Japan vol. 9, No. 239, (P-391), Sep. 25, 1985, abstract of Toshiba, "Integrated Circuit", Japanese 60-091454, May 22, 1985.
Patent Abstracts of Japan vol. 9, No. 174, (P-374), Jul. 19, 1985, abstract of Nipon Denki, "Microdiagnosis System", Japanese 60-049442, Mar. 18, 1985.
Patent Abstracts of Japan vol. 9, No. 79, (P-347), Apr. 9, 1985, abstract of Matsushita Denki Sangyo, "Microprocessor Having Testing Function", Japanese 59-208648, Nov. 27, 1984.

Primary Examiner—Emanuel T. Voeltz
Assistant Examiner—Hal D. Wachsman
Attorney, Agent, or Firm—Foley & Lardner

[57] ABSTRACT

A microprocessor is provided with a self-diagnostic test function. The microprocessor comprises an input circuit for inputting at least a macro instruction and information necessary for self-diagnostic testing stored in an external memory; a decoder for decoding the inputted macro instruction; a micro instruction ROM for storing micro instructions; an incrementer for generating an incremented address by incrementing the address of the received address of the micro instruction ROM by 1. The microprocessor also includes an external test mode setting circuit (ETMSU) that inputs an incremented address and information necessary for self-diagnostic testing, and that outputs an incremented address when the microprocessor is operating in normal mode. In accordance with micro instructions outputted by the micro instruction ROM, the ETMSU outputs either an incremented address or information necessary for self-diagnostic testing when the microprocessor is operating in self-diagnostic testing mode. The microprocessor also includes a selector for selecting in accordance with micro instructions any one of the decoder output, an address of the micro instruction ROM designated by the micro instructions, or the output of the external test mode setting circuit. The microprocessor operates as an ALU when operating in normal mode, and when operating in self-diagnostic testing mode, provides data to diagnose whether or not it is defective.

5 Claims, 6 Drawing Sheets

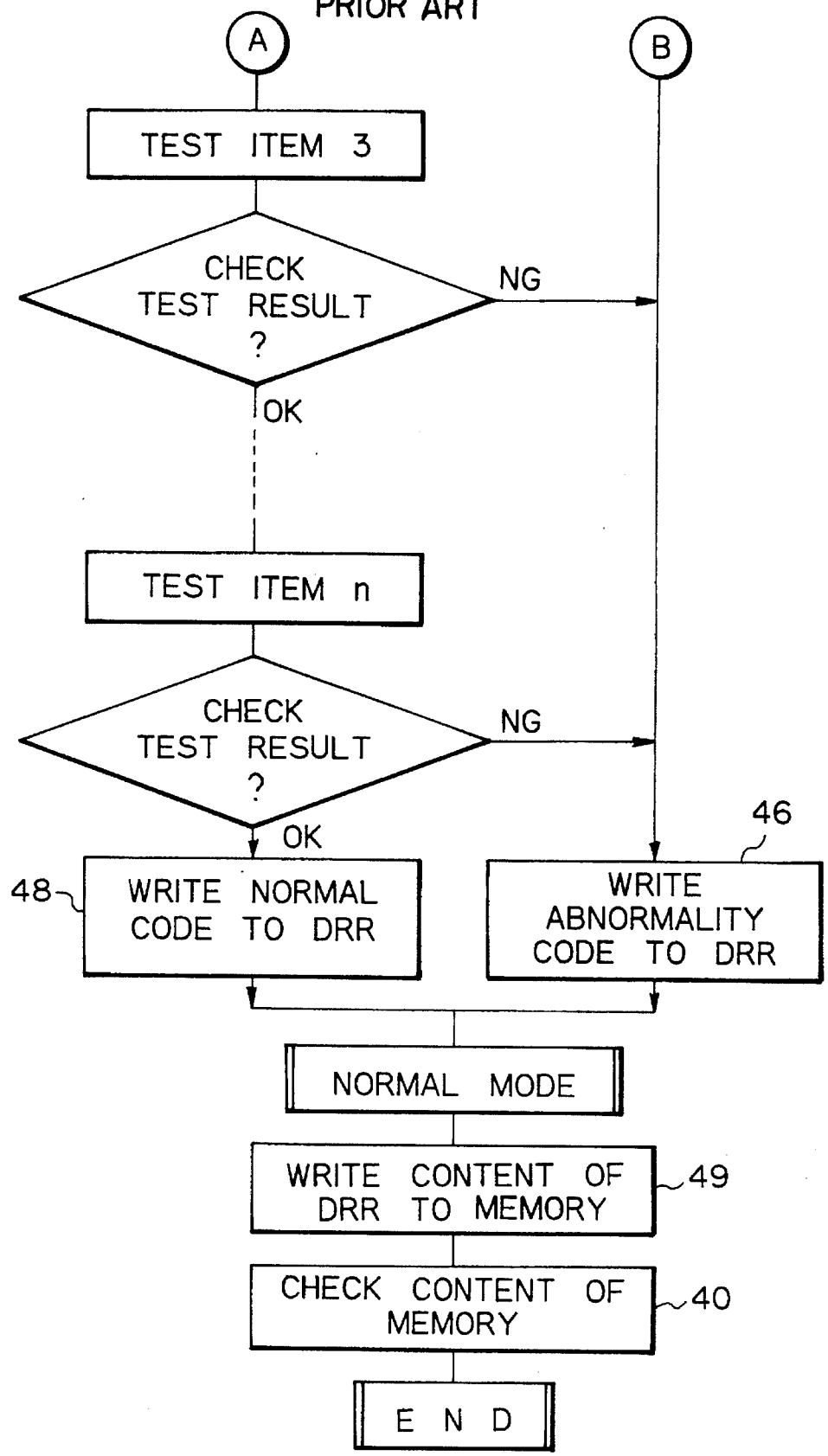

MICROPROCESSOR WITH SELF-DIAGNOSTIC TEST FUNCTION

This application is a continuation of application Ser. No. 08/019,912, filed Feb. 19, 1993, now abandoned.

BACKGROUND OF THE INVENTION

1. Field of the Invention

The present invention relates to a microprocessor of the microprogram-controlled type, and particularly to a self-diagnostic test for such a microprocessor.

2. Description of the Related Art

Semiconductor integrated circuits are produced in quantity on a single silicon wafer using photographic techniques. When structural defects occur in the wafer, however, transistors formed at the defective portions will not function, and a semiconductor integrated circuit incorporating such a transistor cannot be expected to function normally. At the present state of the art, structural defects will to a certain level of probability be included in a silicon wafer, and as a result, defective units will inevitably occur among manufactured semiconductor integrated circuits.

In order to avoid shipping the above-described defective units, all manufactured semiconductor integrated circuits must be tested one by one before shipment to ensure that they operate normally. For this purpose, a testing circuit for semiconductor integrated circuits is employed in which test vectors are inputted at the input terminals of the semiconductor integrated circuit, and the output from the output terminals of the semiconductor integrated circuit is compared with previously prepared vectors of expected values.

When test vectors are inputted to the input terminals of a normal semiconductor integrated circuit, the output from the output terminals will coincide with the expected vectors, and therefore, a semiconductor integrated circuit with output differing from the expected vectors is determined to be a defective article containing malfunctioning transistors.

Should a malfunctioning transistor exist in any portion of a semiconductor integrated circuit, test vectors that do not call this transistor into play will not allow discovery of the defect. Therefore, in order that test vectors be effective, it is imperative that all of the semiconductor integrated circuits and logic without exception be caused to operate.

Nevertheless, even should the vectors call a malfunctioning transistor into play, if the effect of the transistor does not arrive at the output terminals of the semiconductor integrated circuit, a difference from the expected vectors will not be noted and the failure of the transistor will not be detected. This type of problem is peculiar to the test vectors itself, and underlines the necessity of rating the quality of test vectors.

One of the criteria of the quality of test vectors is the fault-coverage. The fault-coverage is an index of the ability to determine that an article is defective based on output differing from the expected vectors obtained after inputting test vectors to a semiconductor integrated circuit containing any defective transistor. The fault-coverage is measured by means of fault simulation.

Fault simulation is carried out by intentionally causing the fault of an arbitrary transistor within a semiconductor integrated circuit in order to simulate a defective circuit and determining whether or not differences from the expected vectors occur at the output terminal. This investigation is conducted by repeatedly simulating faults at different points in the semiconductor integrated circuit.

If the number of simulations carried out by causing faults is defined as the number of sampled faults and the number of these faults producing output differing from the expected vectors is defined as the number of detected faults, the fault-coverage can be expressed as [number of detected faults/number of sampled faults]. Ideal test vectors would achieve a fault-coverage of 100% and would be capable of determining as defective a semiconductor integrated circuit having a malfunctioning transistor in any portion.

Recently, however, the trend of semiconductor integrated circuits towards larger scale and greater complexity has resulted in dramatically greater numbers of incorporated transistors and extremely complex internal operations. Because there consequently are included many transistors that are called into play only under special conditions, the effect of these malfunctioning transistors will become apparent at the output of the semiconductor integrated circuit only in rare instances.

With this type of semiconductor integrated circuit, producing test vectors with a fault-coverage of 100% is an extremely laborious process, and in addition, the resulting test vectors will include an unwieldy number of instructions and a test will require a great deal of time to carry out. Accordingly, for the purpose of easily detecting the existence of malfunctioning transistors within semiconductor integrated circuits containing transistors whose fault is extremely difficult to discover, it is common to provide semiconductor integrated circuits with an easily performed self-diagnostic test function.

Currently, nearly all microprocessors composed of semiconductor integrated circuits employ a microprogram control method. In a microprogram control method, a sequence of instruction code (hereinafter referred to as micro instructions) is stored within an internal microprogram read memory (hereinafter referred to as MROM). The microprocessor reads the micro instructions in order by means of control circuits and delivers the instructions to an execute circuit.

Practically, however, the control circuit, in place of the instruction code, reads the address of the MROM corresponding to the instructions and outputs to the execute circuit the sequence of instruction code beginning with this address. A block diagram illustrating the operation of this microprogram control method is presented in FIG. 1.

A microprocessor using a microprogram control method is provided with a micro instruction read memory (to be referred to as MROM) 13a, a first selector 8, a microprogram address register (MAR) 10, an incrementer 7, an instruction decoder 6, an align instruction register (AIR) 5, and logical circuits 4a, 4b, 4c, 4d, 4e, 4f. Macro instructions received by the microprocessor from the outside through an external terminal 1 are transferred to the instruction bus 14 through an input circuit 3 made up of a buffer register or an I/O and stored in the align instruction register 5. The results of computation carried out by logical circuits 4a–4f in accordance with the micro instructions stored in MROM 13a are then transmitted to the external circuit from output circuit 2. The instruction decoder (ID) 6 generates microprogram address S17 in order to read the micro instructions needed to perform the macro instruction. Microprogram address S17 is supplied to the address input of MROM 13a through the first selector 8. The incrementer 7 increments selector output signal S25 by 1, and then generates the next microprogram address (incremented address). The incremented address S21 is stored within the microprogram address register 10. MROM 13a receives selector signal S25 and outputs the corresponding micro instructions S19. These micro instructions S19 are composed of control signal S19b, which actually manipulates the data, and control signal S19a, which is directed to the first selector 8.

The first selector 8 responds to selector control signal S16, which is a portion of control signal S19a, and selects any one of the following: the microprogram address indicated by output S21 of the microprogram address register 10, microprogram address S17 supplied from the instruction decoder 6, and address signal S18 which is one field of control signal S19a. If address signal S18 does not designate a microprogram address, the first selector 8, controlled by selector control signal S16, selects the output of the microprogram address register 10. Accordingly, the address input of the MROM 13 becomes the succeeding microprogram address. In cases where address signal S18 designates a microprogram address, the micro instructions S19 corresponding to that address are read from MROM 13 and the microprocessor processes the data in accordance with control signal S19b contained within the micro instructions S19 and output S21 of the microprogram address register 10 is incremented by 1. This operation is iterated, and when address signal S18 is about to stop designating microprogram addresses, the first selector 8, under the control of selector control signal S16, selects output S21 of the microprogram address register 10, and the input of MROM 13a becomes microprogram address S21 created through incrementation. In this way, the micro instructions are successively processed.

When the microprogram corresponding to the inputted macro instruction is completed, the first selector 8 selects microprogram address S17 provided by the instruction decoder 6, and begins processing the macro instruction supplied from the outside. The macro instruction is defined by a plurality of micro instructions and is realized by the ordered execution of the micro instructions.

Since micro instructions are defined in much finer detail than a macro instruction, they can control the internal state of the microprocessor in ways that a macro instruction cannot and can control the operations of transistors that cannot be operated in normal operation. Consequently, self-diagnostic tests are widely carried out in microprocessors using these micro instructions.

FIG. 2 (encompassing FIGS. 2A and 2B) is an operation flow chart illustrating the operation of the blocks in FIG. 1. First, the microprocessor is reset (step 41) and the minimum necessary initialization is carried out (step 42), after which the microprocessor begins normal operation.

When a self-diagnosis instruction, which is applied as a macro instruction from external terminal 1, is stored in the align instruction register 5 by way of the input circuit 3 and the instruction bus 14, microprogram address S17 of a self-diagnosis microprogram is generated by means of the instruction decoder 6.

This microprogram address S17 is selected by the first selector 8, delivered to MROM 13a which stores microprogram instructions, and a microprogram (MP) read from that address is executed (step 43). In other words, control signal S19b supplied from MROM 13 is transmitted to each portion of the microprocessor.

The microprogram used in this micro self-diagnosis supplies the data built into the microprogram to logical circuit 4a made up of a register, a logical operation circuit, etc., which are the subjects of this microprocessor test, initiates the logical operation (step 44), and then compares the results with the expected value provided in the microprogram to determine whether or not they agree (step 45). If the values do not agree, the execution of the self-diagnostic instruction is interrupted at this point and the abnormality code is written to the diagnosis result register (DRR) in the microprocessor (step 46). The microprocessor then returns to normal operation.

If the results of this comparison show agreement, the same test is performed on logical circuit 4b which is the subject of the next test (step 47). When the self-diagnostic instructions have been carried out, the normality code is written to the above-described diagnosis result register (step 48) and the microprocessor returns to normal operation. When the self-diagnosis macro instruction has been completed, the microprocessor transmits the contents of the diagnosis results register to a memory outside the microprocessor (step 49) and checks the results of the self diagnosis (step 40).

This method allows testing of the signals within the microprocessor with virtually no need for adding special testing hardware and enables verification from the outside of the state of components which are extremely difficult to check during normal operating conditions.

However, this self-diagnostic microprogram must be established in the design of the microprocessor, and consequently, when revising the microprogram to allow more detailed detection and a higher fault-coverage, it is necessary to modify the design of the microprogram provided in the microprocessor. As a result, the self-diagnostic microprogram may not be easily added to or modified.

Next will be considered the microprocessor defect analysis. When the quality of a microprocessor has been judged as inferior, it is necessary to employ a semiconductor testing circuit by which various data are applied to an external terminal of the microprocessor, and based on the output produced by the microprocessor in performing a series of elementary operations or a series of micro steps designated by one or more test instructions, the defective point in the hardware is analyzed. In this analysis, however, there is no alternative to depending on the output of the microprocessor as a basis for investigating and making inferences, and this severely complicates the pinpointing of a faulty micro step causing the malfunctioning of the microprocessor.

As a solution to this problem, there is the WCS (Writable Control Store) method in which the microprogram read memory is made into RAM to render the microprogram alterable. In this method, when control over a detailed operation of the interior of the microprocessor is desired, such as in defect analysis, it is possible to write a microprogram from the outside and execute it in order to allow the effective performance of defect analysis.

The conventional microprocessors described above have problems which will be set forth below.

Because it is generally very difficult to raise the fault-coverage, it is usual to incorporate into the microprocessor a circuit for judging the state of the microprocessor itself. In this case, test logic using a microprogram is employed in order that there be nearly no increase in the amount of hardware. However, even with this method, it is extremely difficult to create a microprogram for testing that will enable a superior fault-coverage rate and a speedy defect analysis. Fundamentally, it is preferable that a microprogram for testing be designed at the time the microprocessor itself is designed, but because the design of a good microprogram for testing is extremely time-consuming, it is the common practice to begin preparing and revising a microprogram for testing only after the microprocessor has been produced. However, revisions of a microprogram entail the necessary revision of the microprocessor hardware itself as well as the redesign of the microprocessor, at a considerable expense of time and labor. Further, since it is necessary in the conventional method to store the test data for testing the microprocessor in the MROM, the provision of sufficient data for testing leads to the problem of an unwieldy MROM.

With regard to defect analysis of the microprocessor, since conventional testing methods only provide the results of a series of micro steps designated by one or more test instructions and not the result of an individual micro step, only the absence or existence of a defect can be determined. If an abnormality is discovered in an early test item among the test instructions, it will remain unknown whether the following tests provide correct results or not. In addition, there is the problem that for defects that cannot be discovered by tests based on the provided data, the tests serve no purpose.

The testing method of making the microprogram read memory RAM and then writing and executing the testing microprogram from the outside allows effective execution of the defect analysis, but there is the problem that the necessity for hardware for writing to the microprogram read memory increases the amount of hardware. In addition, RAM takes more area on a substrate than ROM, increasing the area necessary for the microprocessor. In order to actually start a self-diagnostic test, there is also the problem of the time required to write all of the test microprograms before the self-diagnosis can begin.

SUMMARY OF THE INVENTION

The purpose of the present invention is to provide a microprocessor provided with a self-diagnostic test function in which the process of revising the test items and test data can be carried out easily without need of altering the microprocessor hardware, and in which an acceleration of defect analysis and a reduction of the test time are realized by the provision in advance of the optimum test items and test data.

In order to achieve the above-described purpose, the microprocessor of the present invention comprises:

input means to input at least a macro instruction and the information necessary for a self-diagnostic test stored in an external memory;

decoding means for decoding the inputted macro instruction;

micro instruction ROM means for storing the micro instructions;

incrementing means to increment a received address of the micro instruction ROM means by 1 and generate an incremented address;

external test mode setting means that inputs the above-described incremented address and information necessary for a self-diagnostic test, outputs the incremented address when the microprocessor is operating in normal mode, and, in accordance with the micro instructions outputted by the above-described micro instruction ROM means, outputs either the incremented address or the information necessary for the self-diagnostic test when the microprocessor is operating in self-diagnostic test mode; and selector means that, in accordance with the micro instructions, selects one of the output of the decoder means and the output of the external test mode setting means; and at least one logical circuit that operates as an ALU when the microprocessor is operating in normal mode, and operates as the test subject in accordance with the micro instructions when the microprocessor is operating in self-diagnostic test mode.

It is preferable that the information necessary for the self-diagnostic test be information corresponding to the items and the data necessary for testing the test items, stored in the source address of the external memory.

The above and other objects, features, and advantages of the present invention will become apparent from the following description when taken in conjunction with the accompanying drawings which illustrate an example of a preferred embodiment of the present invention.

DETAILED DESCRIPTION OF THE PREFERRED EMBODIMENT

Figure 3:
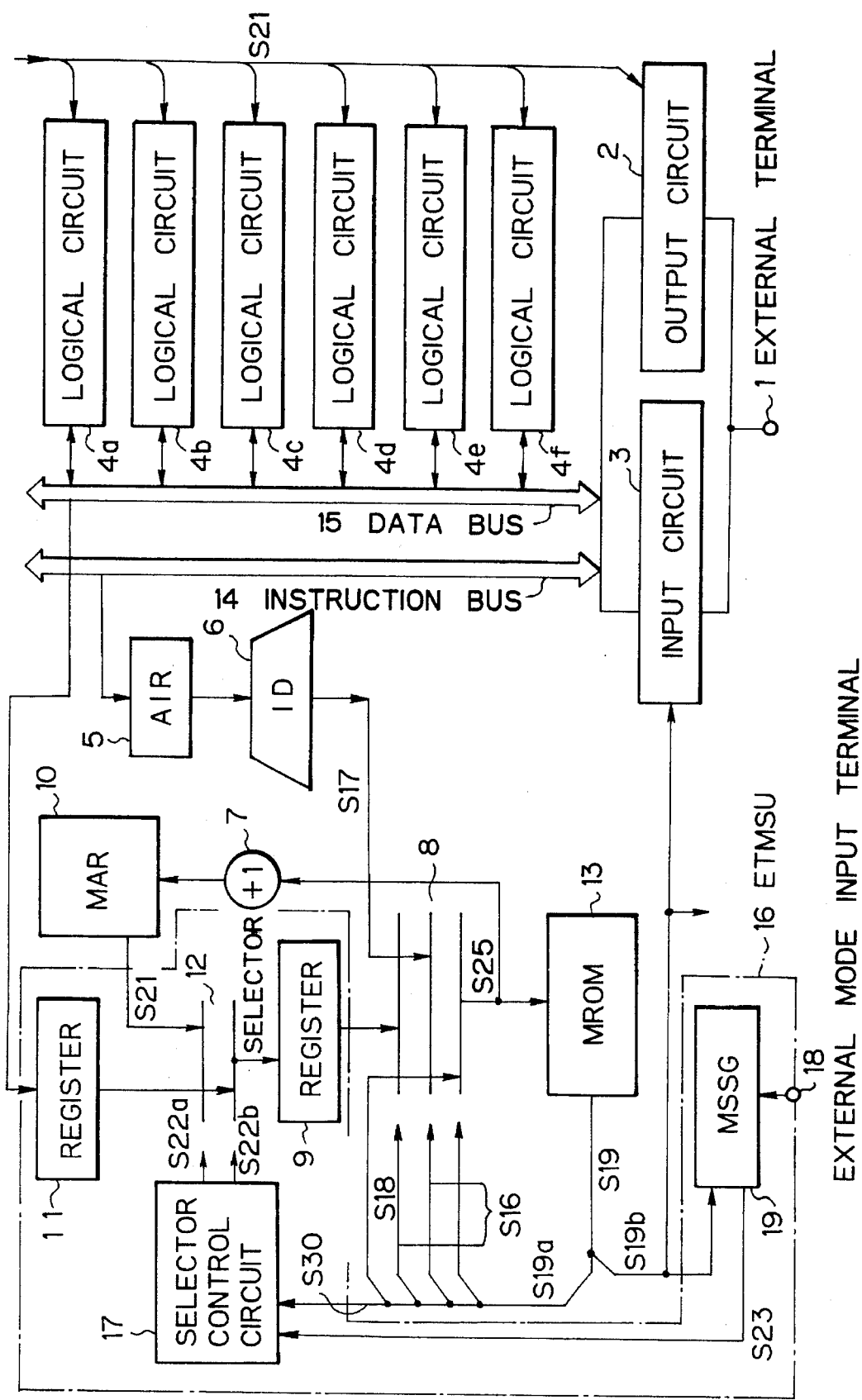
FIG. 3 is a block diagram of an embodiment of the present invention.
Figure 4:
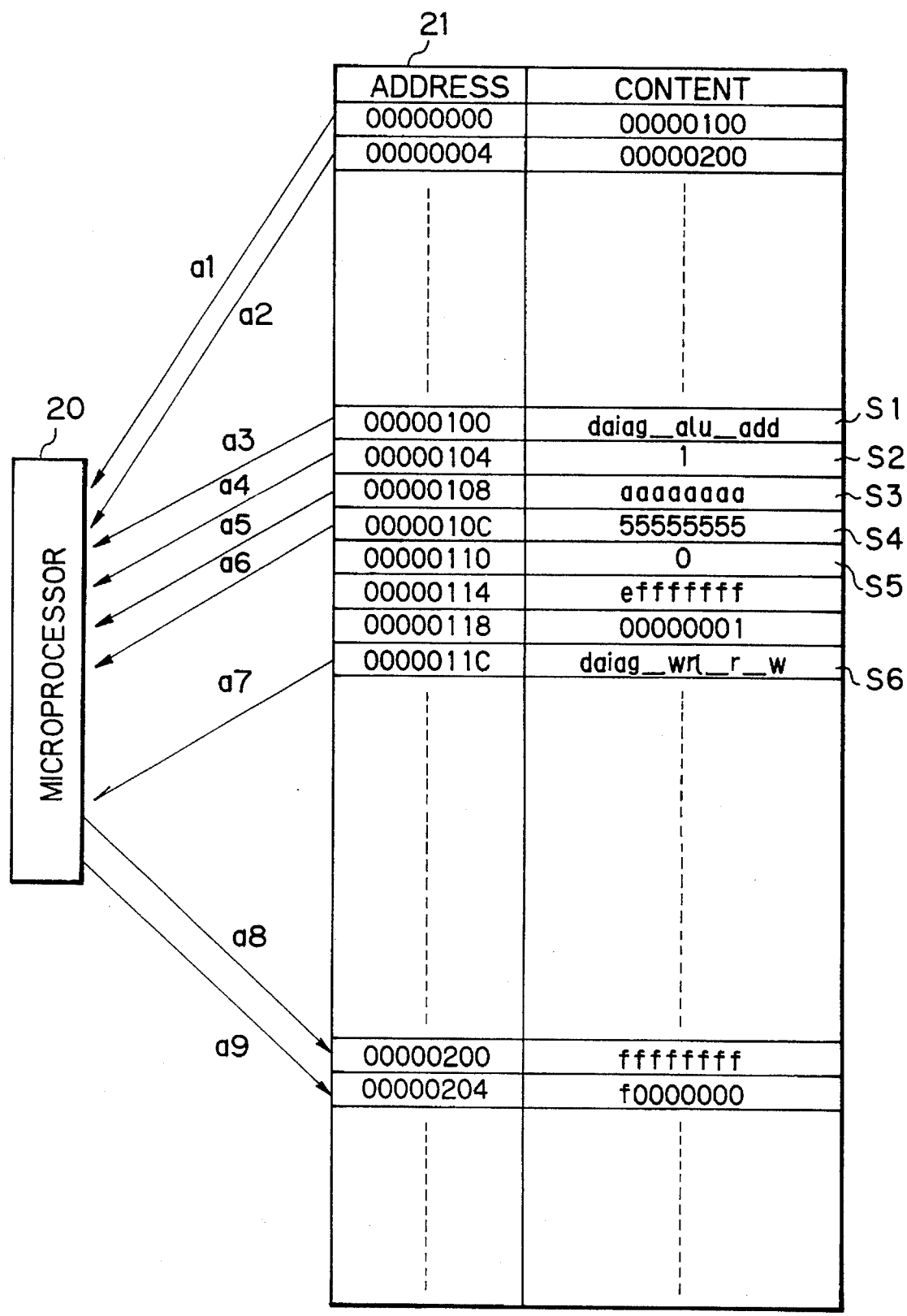
FIG. 4 shows the contents of an external memory for the purpose of illustrating the self-diagnostic test of the apparatus shown in FIG. 3.

An example of a preferred embodiment of the present invention will next be described in conjunction with the figures. FIG. 3 is a block diagram of an embodiment of the present invention. FIG. 4 shows the contents of an external memory for the purpose of illustrating the self-diagnostic test of the apparatus of FIG. 3.

Figure 1:
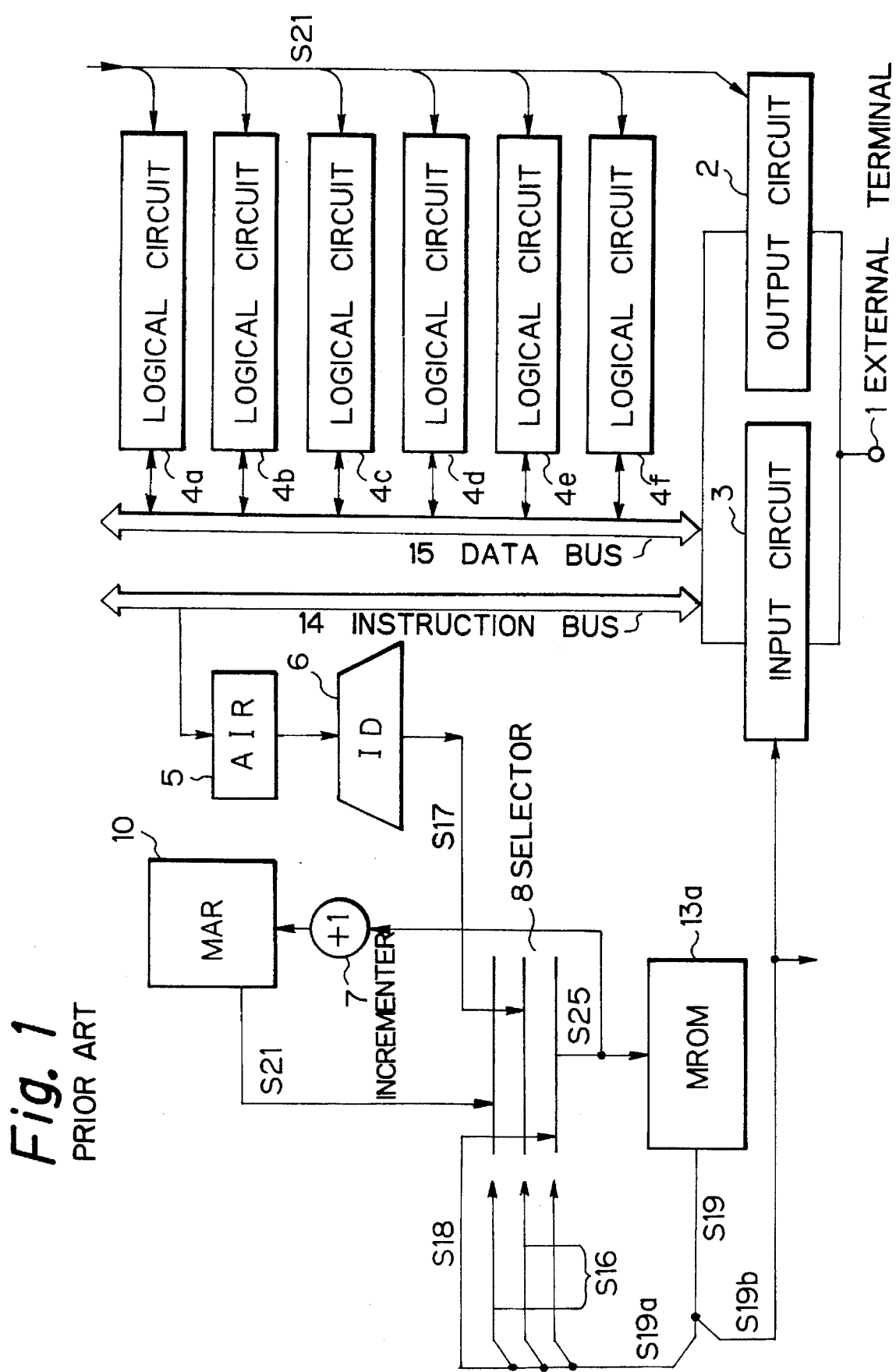
FIG. 1 is a block diagram of an example of a microprocessor of the prior art.

One difference between the microprocessor of the present embodiment and the microprocessor shown in FIG. 1 is that for each particular self-diagnostic test, test items, data (test data) used in the test, and operation results for the self-diagnostic test are stored in an external memory such as the one shown in FIG. 4. Another difference is that an external test mode setting unit (ETMSU) 16 is provided so that, when operating in test mode, the microprocessor may execute self-diagnostic testing in accordance with the micro instructions stored in the micro instruction read only memory (MROM) 13 using the data and test items stored in the external memory. In this way, when operating in test mode, the microprocessor introduces test items and test data from the external memory. Consequently, while the input circuit 3 and data bus 15 of the present embodiment have the same hardware as shown in FIG. 1, they receive different input. In addition, because the microprocessor writes the operation results of the self-diagnostic test to the external memory, although the hardware of the output circuit 2 of the present embodiment is identical with the output circuit of FIG. 1, it receives different output control Also., as will later be explained, control signal S19a of micro instruction S19 contains control signal S30 that designates a selector control circuit 17 provided within the external test mode setting unit 16. By means of the control of control signal S30, the data stored in the external memory can be introduced into the operation of the self-diagnostic test under the directions of the micro instructions.

The external test mode setting unit 16 consists of a first register 11, a second selector 12, a second register 9, a selector control circuit 17, a mode selection signal generating circuit (MSSG) 19, and an external mode input terminal 18. The first register 11 is connected to the data bus 15 and holds the data transmitted from the external memory. The second selector 12 connected to its two data inputs, the output of the first register 11 and the microprogram address register 10, and in response to selection signals S22a and S22b outposts one of these two data inputs to the first selector 8 through the second register 9. The external mode input terminal 18 is applied with a signal which becomes active when the test mode is in operation. Upon initiation of operation of the microprocessor, the mode selection signal generating circuit 19 is activated by micro instructions at the end of initialization of the internal state of the microprocessor, and when the input of external mode input terminal 18 is active, the mode selection signal generating circuit 19 activates mode selection signal S23 and informs the selector control circuit 17 that the present mode is the self-diagnostic test mode. In this case, when control signal S30 is active, the selector control circuit 17 activates selection signal S22b and connects the output of the first register 11 to the second register 9. When control signal S30 is inactive, the selector control circuit 17 activates selection signal S22a and connects microprogram address register output S21 to the second register 9.

When operating in normal mode, the mode selection signal generating circuit 19 makes mode selection signal S23 inactive. In this way, the selector control circuit 17 activates selection signal S22a and connects microprogram address register output S21 to the second register 9.

Figure 5:
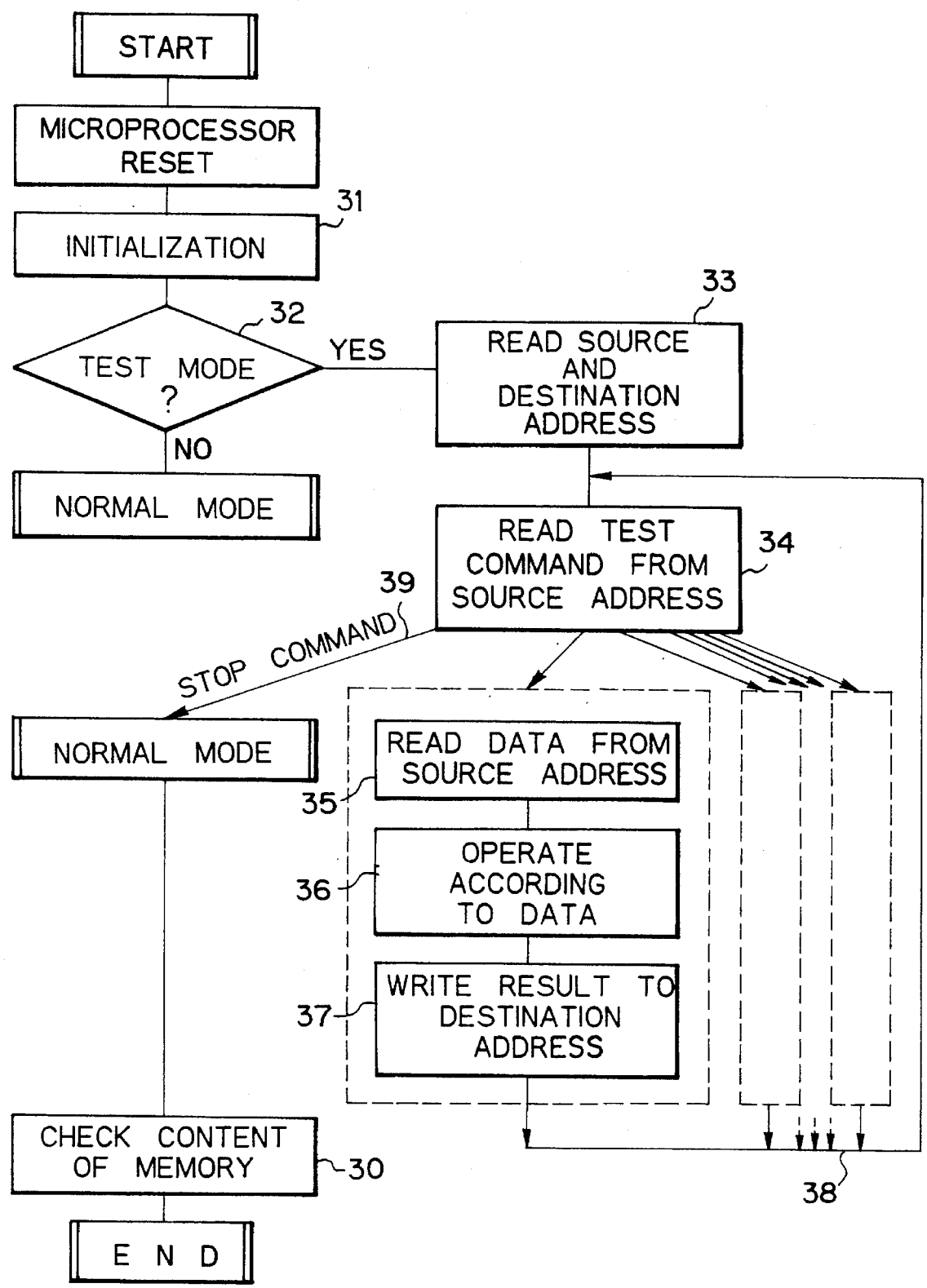
FIG. 5 is an operation flow chart illustrating the self-diagnostic test of the apparatus shown in FIG. 3.

FIG. 5 is an operation flow chart illustrating the self-diagnostic test of the apparatus of FIG. 3.

After resetting, the microprocessor of the present embodiment begins running, starting with the reset microprogram among its internal microprograms whereby the internal state of the microprocessor is first initialized (step 31). At the very end of this microprogram, the microprogram starts up the mode selection signal generating circuit 19 by micro instructions, activates mode selection signal S23 if the input of the external mode input terminal 18 is active, and informs the selector control circuit 17 that the present mode is the self-diagnosis test mode.

If the input signal of the external mode input terminal 18 is inactive, normal operation is continued (step 32). When entering the self-diagnostic test mode, as shown in a1 of FIG. 4, the micro processor generates a bus cycle and reads as a source address the contents, 00000100 (hexadecimal), of the 00000000 (hexadecimal) address of the external memory connected to the microprocessor, following which it reads as a destination address the contents 00000200 of the 00000004 (hexadecimal) address (a2 of FIG. 4, step 33 of FIG. 5). Test command S1 stored in source address 00000100 (hexadecimal) is then read through external terminal 1 (a3 of FIG. 4, step 34 of FIG. 5). The hexadecimal code of this test command (daiag . . . add) indicates the address of MROM 13, where, in this embodiment, the microprogram is stored that causes the computing element inside the microprocessor to perform an addition operation.

Test command S1 is stored in the first register 11 by way of external terminal 1, input circuit 3, and data bus 15, following which it is transferred to the second resister 9 through the second selector 12 and supplied to MROM 13 through the first selector 8 to cause the corresponding control to be executed.

In this case, the output signal of the first selector 8 is incremented to the next microprogram address S21 by means of the incrementer 7, and by means of output signals S22a and S22b of the selector control circuit 17, the second selector 12 selects signal S21 delivered from the microprogram address register 10 and stores it in the second register 9.

Figure 2A:
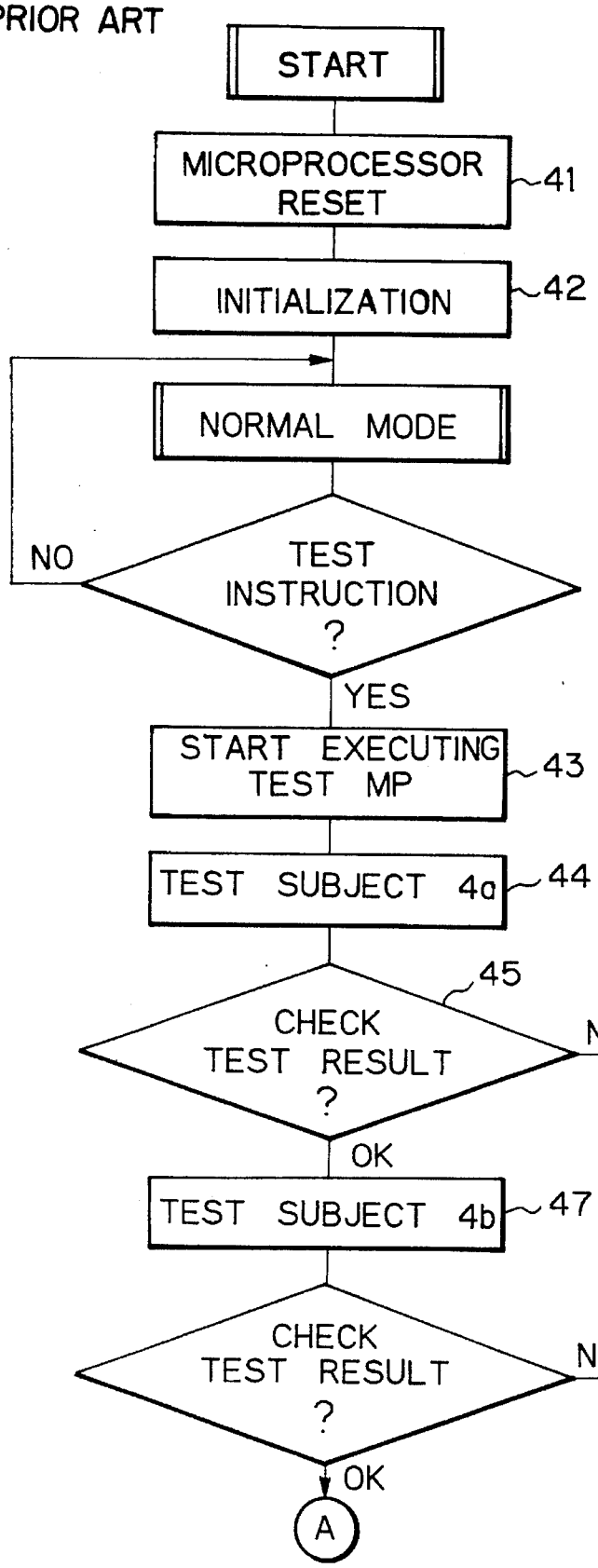
FIG. 2 (encompassing FIGS. 2A and 2B) is an operation flow chart illustrating a self-diagnostic test that uses the blocks of FIG. 1.

This operation is subsequently iterated. By means of this sequence of microprogram read-out control, data is read in order from source address 00000100 (a4–a6 of FIG. 4, step 35 in FIG. 5), and addition is performed of the two words of data S3 and S4, which are the contents of addresses 00000108 and 0000010C of FIG. 4 (step 36 of FIG. 5). The results are then written to the destination address 00000200 (a8 of FIG. 2, step 37 of FIG. 3).

The contents S2 and S5 of FIG. 4 are stop codes, and the operation is iterated until "0" is read out as the stop code (in this test instruction, any data other than "0" delivered from the memory 21 is an indication to continue the operation). If the stop code is "0", the operation is carried out once more before moving on to the next test instructions S6 of FIG. 4 which activate the microprogram in the same manner and begin self-diagnosis (a7 of FIG. 4, 38 of FIG. 5). If the inputted self-diagnosis command is a stop command, the microprocessor returns to normal operation (39 of FIG. 5).

In this way, simply by arranging the test command and associated data followed by the stop command in the source address, the microprocessor reads the commands and data, carries out the test in accordance with the test command, and writes the results to the destination address.

After completing self-diagnostic testing, the test of the internal states of the microprocessor can be carried out by comparing the results written to this destination address with the expected values (step 30 in FIG. 5).

A highly efficient defect analysis can be carried out by modifying in various ways the self-diagnosis command and the data which are arranged in the source address. Modifying the self-diagnosis command and the data can be quickly and easily achieved by writing to the RAM outside the microprocessor.

Furthermore, in the present embodiment the subjects of the self-diagnostic test are logical circuits 4a–4f, but other circuits can also be tested in the same way, for example input circuit 3 or output circuit 2, which are connected to the internal data bus 15.

As explained above, the microprocessor of the present invention is provided with an external test mode setting unit that can arbitrarily select normal mede operation or test mode operation, and when the test mode is selected, a self-diagnostic test for the test items stored in the external memory can be carried out in accordance with a microprogram using the test data stored in that memory. The test items or data stored in the external memory can be easily modified without any need to alter the microprocessor hardware, and in addition, because the microprogram is capable of controlling micro steps of the semiconductor integrated circuits, by appropriately selecting test items and data, the time needed for testing can be reduced, the fault-coverage at the time of shipment can be raised, and the number of shipped defective articles can be reduced. At the same time, when analyzing defects, because the most appropriate test items and data can be prepared beforehand for detecting these defects, the present invention also has the effect of enabling the realization of a higher-speed defect analysis.

It is to be understood that although the characteristics and advantages of the present invention have been set forth in the foregoing description, the disclosure is illustrative only, and changes may be made in the arrangement of the parts without departing from the scope of the appended claims.

What is claimed is:

1. A microprocessor provided with a self-diagnostic test function which operates in a normal mode and in a test mode, comprising:

input means for inputting an encoded normal command which controls the normal mode of operation and for inputting a test command and test data fetched from an external memory for self-diagnostic testing;

decoder means for decoding the encoded normal command supplied from said input means and outputting a decoded normal command as a result thereof; and micro instruction ROM means for supplying a micro instruction in response to a supplied address, said input means and said decoder means making up a first signal path to supply the decoded normal command to said micro instruction ROM means, wherein said microprocessor further includes:

external test mode setting means for providing a second signal path from said input means to said micro instruction ROM means to supply the test command and the test data to said micro instruction ROM means, and for controlling said second signal path to transmit the test command and the test data through said second signal path as path test information when said microprocessor operates in the test mode, and first selector means for selecting, as a selected signal, in accordance with a first code described in the micro instruction delivered from the micro instruction ROM means, either the decoded normal command, the path test information or an address of the micro instruction ROM means described in the micro instruction delivered, and providing the selected signal to the micro instruction ROM means as an output of the first selector means, said external memory storing normal commands and desired numbers of test commands and test data, each of said test commands designating a test item, said test item being a series of micro steps including a series of a desired number of micro steps to be tested and a micro step to write a test result of said series of said desired number of micro steps to be tested to a destination address of said external memory.

2. A microprocessor as claimed in claim 1, wherein said microprocessor is provided with incrementing means for incrementing the output of said first selector means to generate an incremented address thereof, and said external test mode setting means comprises a mode selection signal generating means, second selector means, and selector control means, wherein said mode selection signal generating means generates a mode selection signal in response to an external signal, said mode selection signal being in a first state when said microprocessor operates in the test mode, and said mode selection signal being in a second state when said microprocessor operates in the normal mode, said second selector means inputs the incremented address, the test command and test data as input signals, and selects one of the input signals as the output of said external test mode setting means in accordance with a first selection signal generated by said selector control means, and said selector control means inputs said mode selection signal and a second code described in the micro instruction delivered from said micro instruction ROM means, and provides a second selection signal to control said second selector means such that, when said microprocessor is operated in the normal mode, said second selector means selects the incremented address, and when said microprocessor is operated in the test mode, said second selector means selects either the test command, the test data or the incremented address in accordance with the second code.

3. The microprocessor as claimed in claim 2, wherein the micro instruction has fields for describing the first and second codes.

4. The microprocessor as claimed in claim 1, wherein the test command and the test data are stored in source addresses of said external memory, and the test item includes a micro step to read data from said source addresses.

5. The microprocessor as claimed in claim 1, wherein said micro instruction has a control signal field for indicating whether said incremented address is to be transmitted to said micro instruction ROM means, and whether the test command and the test data is to be transmitted to said micro instruction ROM means.

* * * * *